United States Patent [19]

Quinlan

[11] Patent Number: 4,720,627
[45] Date of Patent: Jan. 19, 1988

[54] ION SENSITIVE PHOTODETECTOR

[75] Inventor: Kenneth P. Quinlan, Newton, Mass.

[73] Assignee: United States of America as represented by the Secretary of the Air Force, Washington, D.C.

[21] Appl. No.: 925,954

[22] Filed: Nov. 3, 1986

[51] Int. Cl.$^4$ ............................................ H01L 23/56
[52] U.S. Cl. .................................... 250/211 J; 357/30
[58] Field of Search ........................ 250/211 J, 578; 357/30 D, 30 R, 8

[56] References Cited

U.S. PATENT DOCUMENTS

| 3,873,215 | 3/1975 | Quinlan | 356/218 |
| 4,665,609 | 5/1987 | Henry et al. | 357/30 D |

OTHER PUBLICATIONS

"Gate-Controlled Diode for Ionic concentration Measurement" from the IEEE Transactions on Electron Devices, vol. Ed. 26., No. 12, Dec. 79, pp. 1945-1951.
"Proton Ejection Accompanying Light Induced Electron Transfer between Chlorophyll and Hydroquinone" from Photochemistry and Photobiology 1967, vol. 6, pp. 665-667.
"Proton Ejection Accompanying Light-Induced Electron Transfer in the Chlorophyll-Quinone System" from the Journal of Physical Chemistry, vol. 71, No. 12, pp. 113-114.
"Light Induced Proton Ejection and Electron Transfer in the Zinc Tetraphenylporphin-Benzoquinone System" from the Journal of Physical Chemistry, vol. 72, No. 5, pp. 1797-1999.
"Proton Movement Accompanying the Light Induced Electron Transfer in the Chlorophyll-Quinone Systems" from Photochemistry and Photobiology 1971, vol. 13, pp. 113-121.
"Silicon Photocells," Hamamatsu 1983 Catalog, 1983, pp. 1 to 11.

Primary Examiner—David C. Nelms
Assistant Examiner—Stephone B. Allen
Attorney, Agent, or Firm—Stanton E. Collier; Donald J. Singer

[57] ABSTRACT

A photodetector using a modified gate controlled diode has therein a layer of photoactive material. Photons interacting therein cause the formation of free protons which alter the electrical characteristics of the photodetector. The change in electrical characteristics is measureable and related to the intensity of photons received.

3 Claims, 1 Drawing Figure

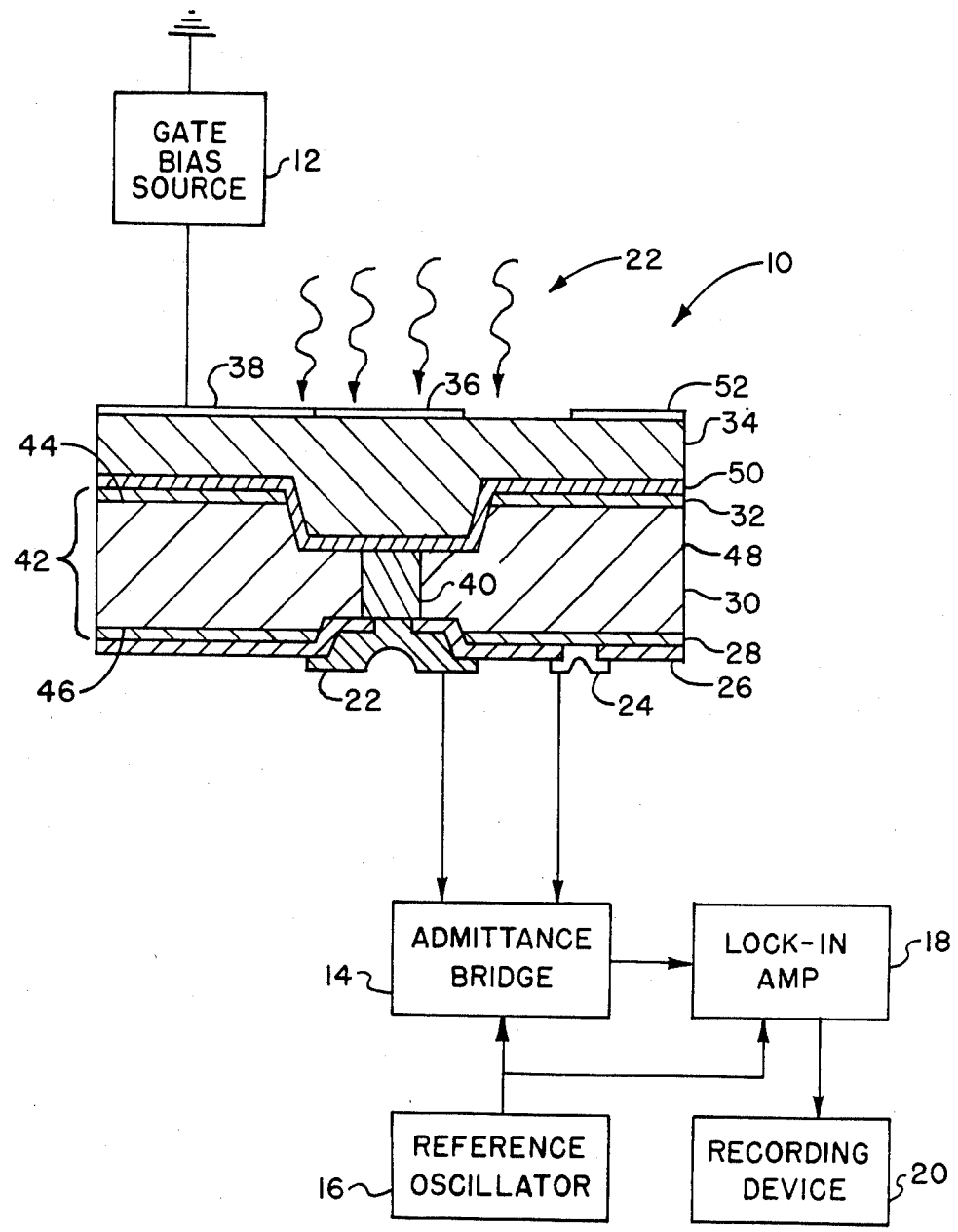

ION SENSITIVE PHOTODETECTOR

STATEMENT OF GOVERNMENT INTEREST

The invention described herein may be manufactured and used by or for the Government for governmental purposes without the payment of any royalty thereon.

BACKGROUND OF THE INVENTION

The present invention relates to photodetectors, and, in particular, relates to photodetectors that operate in a range of about 0.2 microns to 1.8 microns.

One major problem with present photodetectors is that they lack a broad range of light sensitivity. For example, a p−i−n photodiode is sensitive to photons with energies near the band gap energy. If hv is less than $E_g$, the photons will not be absorbed; on the other hand, if the photons are much more energetic than $E_g$, they will be absorbed very near the surface, where the recombination rate is high. Therefore, it is necessary to choose a photodiode which is sensitive to a particular region of the spectrum. This generally means that semiconductor diodes such as GaAs, Si, and Ge respond best to band gap light. For example, a silicon diode responds to a range from about 0.3 to 1.0 μm. Germanium photodetectors have a range of about 0.6 to 1.9 μm.

If very low level optical signals of a desired wavelength are to be detected, the photodetector can be operated in the avalanche mode.

Although present apparatus can measure light intensity over a limited range, a much broader range is desired.

SUMMARY OF THE INVENTION

The present invention sets forth a photodetector that is adaptable to a range of wavelengths.

In particular, the invention includes a modified gate-controlled diode, a gate bias source, an admittance bridge, a reference oscillator, a lock-in amplifier, and a means for measuring the difference in frequency as the modified gate-controlled diode is exposed to a beam of light to be measured as to intensity. The amount of change in frequency to maintain the same capacity, for example, is directly related to the intensity of the beam in the present invention.

The modified gate-controlled diode is a cylindrical wafer having thereon a bottom insulating layer with an emitter and a collector contacts therethrough; a highly doped donor layer abuts the bottom insulating layer having only the drain contact joined thereto; a n-type substrate of the wafer contacts the bottom insulating layer and the doped donor layer to form the drain; a highly doped acceptor section forms the source and has the drain thereabout. The bottom surface of the source contacts the source contact and the bottom insulating layer. A highly doped donor layer is on the top of the substrate drain and a top insulating layer is in contact with the top of the highly doped donor layer, the substrate drain, and the source. The top insulating layer is chemically non-reactive to a photoactive layer which is positioned over the top insulating layer. A gate electrode is attached over the photoactive layer. In the preferred mode of operation, the diode is reversed biased. Exposure to a beam of light of the photoactive layer causes a charge-separation or ion (protons) movement which directly affects the operating capacitance of the reversed-bias diode. Therefore, the capacitance of the diode may be held constant by changing the frequency. This change in frequency relates to the intensity of light received. The photoactive layer may either be a solid or a liquid.

This change in operating frequency is measured by, for example, an admittance bridge, a reference oscillator, a lock-in amplifier, and a means for measuring the change in frequency. Additional electrical devices may be required to convert this frequency difference to the light intensity.

It is therefore one object of the present invention to provide a photodetector that can detect a broad range of wavelengths.

It is another object of the present invention to provide a photodetector having a photoactive composition therein that may be selected based upon the wavelength to be detected.

It is another object of the present invention to provide a photodetector that is a modified gate-controlled diode.

BRIEF DESCRIPTION OF THE DRAWING

The only FIGURE illustrates by schematic the present invention.

DETAILED DESCRIPTION OF THE PREFERRED EMBODIMENT

Referring to the only FIGURE, a photodetector 10 is connected to a gate bias source 12 and an admittance bridge 14. The admittance bridge 14 is further connected to a reference oscillator 16 and a lock-in amplifier 18. The lock-in amplifier 18 is further connected to a recording device 20 that outputs appropriate information such as the light intensity of a beam 22 of light being of an infrared wavelength, for example. Although, a broad range of wavelengths for detection is desired and made possible by the present invention.

Further, although the present invention is shown as a single photodetector 10, it is clearly within the scope of the invention to place multiple photodetectors 10 on a single IC with the related electronics to output, for example, digital signals as to the intensity of each photodetector 10. Such electronics could include not only the above items but phase-lock loops, counters, and processors.

Referring in particular to photodetector 10, a wafer 42 is an n-type semiconductor single-crystal silicon wafer which has upon a top surface 44 and a bottom surface 46, a highly doped donor (n+) layer 32 and (n+) layer 28, respectively. An electrically insulating layer 26 is placed on bottom highly doped donor layer 28. Layer 26 has a drain contact 24 and a source contact 22 therethrough. Emitter contact 24 is bonded to layer 28 and source contact 22 is bonded to a source 40 being a highly doped acceptor area. Substrate 30 being n-type acts as a drain 48 of the photodetector 10. A layer 50 is deposited upon the highly doped donor layer 32. Layer 50 is a layer which is electrically insulating as well as chemically inactive to the material of photoactive layer 34. Photoactive layer 34 is preferably solid but an encapsulated liquid layer is possible.

Layer 50 may be aluminum oxide, zinc oxide, or tantalum oxide or other materials that satisfy the criteria noted above.

Photoactive layer 34 may be essentially a mixture of porphyrin-quinone. U.S. Pat. No. 3,873,215 is incorporated by reference as to the teachings contained therein especially those directed at the light sensitive compounds.

It has been found that certain light sensitive porphyrin-quinone solutions eject protons and uptake protons when illuminated. Charge separation accompanies the movement of protons and is observed in light-sensitive solid solutions. The amount of uptake or ejection is proportional to the light intensity with a constant porphyrin concentration. The wavelength can be varied over a wide range which depends on the absorption characteristic of the porphyrin. When the light sensitive porphyrin-quinone solution is exposed to light, protons are ejected into the surrounding media. The photoresponse of the photodetector 10 may also arise from a charge-transfer mechanism of layer 34.

Many porphyrins can be used as a component of the photoactive layer 34. Chlorophyll a, chlorophyll b, pheophytin, bacteria-chlorophyll and zinc tetraphenylporphin have been found to be especially useful. Hydroquinone and benzoquinone have been found useful as the quinone component. Hydroquinone gives greater responses. With the use of benzoquinone, air can be present but air must be absent when using hydroquinone as the quinone component. The porphyrin concentration is usually in the range of about $10^{-2}$ to $10^{-5}$ moles while the quinone concentration is generally in the range of about $10^{-2}$ to $10^{-4}$ moles. The photoactive layer 34 need not be limited to porphyrins-quinone (hydroquinone) systems.

A protective layer 52 may be deposited over photoactive layer 34 to prevent any environmental impact such as oxidation of the chemicals therein. Layer 52 is only partially shown thereon. A gate electrode 36 is deposited either upon layer 34 or layer 52 as the case may be. Lead 38 provides the connection to the gate bias source 12.

The only FIGURE shows the structure of a three-terminal modified gate-controlled photodetector 10. There are three possible ways to measure the differential admittance of photodetector 10. One way to measure the admittance is through the gate electrode 36 and contacts 22 and 24 by an essentially standard MOS measurement. The second method of measurement is through the gate electrode 36 and source contact 22 with substrate 30 floating or shorted to the source. The preferred method described is through the source contact 22 and drain contact 24 with the gate electrode 36 controlled by a bias voltage.

The differential admittance is measured by means of capacitance bridge 14 and lock-in amplifier 18 with other devices as shown in the FIGURE. When the gate voltage biases the area under insulating layer 50 into accumulation, the admittance is only the p-n junction capacitance between the source and substrate. When a sufficiently negative gate bias voltage is applied, a p-type inversion layer starts to build up. This inversion layer connects to the p+ and the measured capacitance increases drastically due to the extension of the inversion region. Light on the photoactive layer 34 contributes to the capacitance change.

The inversion layer resistivity is dependent on the applied bias. If the operating frequency is high enough, the current cannot follow the voltage in the inversion layer. As a result, the loss term rises and the capacitance decreases.

When the p-n junction is biased, the $C-V_g$ and $G-V_g$ characteristics of the device will change. Sets of $C-V_g$ and $G-V_g$ curves obtained at 10 kHz frequency with different junction bias illustrate such.

When the p-n junction is reverse biased, the depletion region will be widened which requires stronger electric fields at the silicon surface to invert the depletion layer. In other words, a higher negative gate bias is necessary to turn on the inversion layer. This causes the curves to shift in the negative gate bias direction with increased p-n junction reverse bias. The maximum capacitance for strong inversion also decreases due to the widening of depletion layer. When the junction is forward biased, a reverse situation occurs. Since forward bias causes current to flow through the junction, it can only be measured in a relatively small range of forward bias voltages. The bias has the same effect on the $G-V_g$ characteristics.

When porphyrins are excited with light in the presence of quinones or hydroquinones, protons are either ejected into the media by hydroquinone or protons are taken up by the semiquinone that is formed in the porphyrin-quinone reaction. The amount of proton movement is a function of the intensity of light. This movement has been found to be a straight line relationship. The wavelength of light whose intensity is being measured is determined by the absorption properties of the porphyrin. Various wavelengths can be determined by changing the porphyrin e.g., Zn porphyrins, Cd porphyrins, Zn Tetraphenylporphine, pheophytin, etc.

When the photoactive layer 34 is irradiated, proton movement (pH change) or charge separation induces a change in the amount of capacitance of the p-n junction. The change in capacitance is measured by the change in frequency necessary to maintain the original capacitance valve. This change in frequency reflects the intensity of light irradiating the photoactive layer 34. The pH change or charge separation can also be measured as a change in the gate voltage at a fixed value of source-substrate (drain) capacitance.

The photodetector 10 can be fabricated by the following procedure: A (100) oriented single-crystal silicon wafer 42 being 2-$\Omega$cm n-type phosphorus doped and about 12 mils thick is used with only one side polished. After a series of regular cleaning steps, the silicon wafer is coated with a layer of spin-on-dopant glass (p atom concentration of $10^{21}$/cm$^3$) on both sides, after which it is given a drive-in treatment at 1100° C. for 1 hour to produce n+ doped layers 28 and 32 of about 1 μm thick on both sides. The doped glass layer is removed and the wafer is thermally oxidized in a dry oxygen ambient at 1100° C. for 3 hours. This yields 200-nm layers 26 and 50 of SiO$_2$. A 150 μm diameter aluminum dot is evaporated on top of the polished surface through a molybdemun mask. The distance between centers of the aluminum dots was 0.5 mm. The aluminum can be anywhere from 4-6 μm in thickness. The wafer 42 is then subjected to a temperature gradient zone melting process.

The temperature gradient zone melting process is a process in which a liquid zone in the form of a sheet, rod, or droplet migrates through a solid in a temperature gradient. The migration of the liquid zone is caused by three spatially sequential processes: dissolution of the solid on the hot forward side of the liquid zone; diffusion transport of the dissolved silicon to the cold rear side of the liquid zone; and deposition of the silicon-aluminum alloy on the cold rear surface.

In the present case, the front side of the wafer 42 is put directly underneath the infrared light source with the rear side of the wafer radiatively cooled by means of a water-cooled heat sink so that a temperature gradient over 200° C./cm is obtained across the wafer 42. The 150 μm aluminum dot can be stably migrated through the silicon wafer in about 5 minutes. Once the silicon wafer 42 is heated up to around 1200° C., the already molten aluminum dot moves through the 0.20 μm layer 50 and penetrates into the silicon bulk. After migrating through the silicon substrate 30 the Al droplet penetrates the $SiO_2$ layer 26 on the other surface. It is obvious that the gradient grown zone will be degenerate p+ due to the aluminum alloy. As a result, the sharp p—n junction forms.

Conventional lithographic methods are applied to open a window on both sides with the aluminum dot at its center.

The silicon-aluminum alloy zone can be etched in a similar way, although the etching rate is generally not the same. The parameters which control the etching rate include: concentration of KOH, temperature, stirring, ultrasonic agitation, etc. If these factors are properly controlled, the opened windows can be etched down preferentially and become a trapezoid as shown in the FIGURE.

The front surface is etched down about 100 μm. The bottom surface of the etched window is (100) oriented as is the silicon wafer itself and the four sides of the window are all in the (111) direction or its equivalents. A similar etching cycle is carried out to remove the aluminum on the rear side so that contact can be made to the aluminum enriched p+ region.

After the preferential etching is completed, the remaining $SiO_2$ in layer 26 is removed in an HF solution. A thermal oxidation cycle is used to regrow layer 26 of $SiO_2$. A layer of $SiO_2$ with a thickness of approximately 1500 angstroms is grown. A further procedure deposits layer 50 of aluminum oxide in place of $SiO_2$, for example. Additional conventional procedures deposit photoactive layer 34 and protective layer 52 thereon as required.

Clearly, many modifications and variations of the present invention are possible in light of the above teachings and it is therefore understood, that within the inventive scope of the inventive concept, the invention may be practiced otherwise than specifically claimed.

What is claimed is:

1. A photodetector, said photodetector comprising:
   a planar substrate of semiconductor material, said substrate being doped to form a drain of a modified gate-controlled diode, said substrate having essentially parallel top and bottom surfaces, said substrate having opposing windows formed therein, said windows being separate by a distance less than the thickness of said substrate;
   a source, said source being formed between said windows, said source having a highly doped acceptor concentration;
   a pair of highly doped donor layers, said donor layers being attached to said top and bottom surfaces of said substrate;
   an electrically insulating layer, said insulating layer being deposited on said donor layer on said bottom surface of said substrate and on a window in said bottom surface of said substrate, said insulating layer having contact windows therethrough, one of said contact windows having a bottom surface of said donor layer, the other of said contact windows having a bottom surface of said source, each of said windows having therein electrical contacts for leads;
   an electrically insulating and chemically non-reactive layer, said non-reactive layer being deposited on said donor layer on the top surface of said substrate and in a window through said donor layer and into said substrate;
   a photoactive layer, said photoactive layer being deposited on said non-reactive layer, said photoactive layer having therein a porphyrin component and a quinone component, said components being selected to provide a band of wavelengths to which said photodetector shall respond when exposed to a beam of light having said wavelengths therein, a response of said photoactive layer being directly related to the intensity of said beam; and
   a gate bias electrode, said electrode being connected to said photoactive layer.

2. A photodetector as defined in claim 1 further including a protective layer deposited over said photoactive layer to minimize chemical changes to said components therein.

3. A photodetector as defined in claim 1 further including electronic means to measure the change in electrical characteristics of said photodetector when said beam interacts with said photoactive layer, an output of said electronic means being directly related to the intensity of said beam, said electronic means connected to said drain contact, said source contact, and to said gate bias electrode.

* * * * *